(12) United States Patent
Chandrasekaran

(10) Patent No.: US 8,445,994 B2
(45) Date of Patent: May 21, 2013

(54) DISCONTINUOUS THIN SEMICONDUCTOR WAFER SURFACE FEATURES

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 291 days.

(21) Appl. No.: 12/437,111

(22) Filed: May 7, 2009

(65) Prior Publication Data

US 2010/0283131 A1   Nov. 11, 2010

(51) Int. Cl.
*H01L 29/06* (2006.01)

(52) U.S. Cl.
USPC .................. 257/622; 257/43; 257/127

(58) Field of Classification Search
USPC ....................................... 257/622
See application file for complete search history.

(56) References Cited

U.S. PATENT DOCUMENTS

| 6,025,250 | A | 2/2000 | Ha et al. |
| 6,103,593 | A | 8/2000 | Hui |
| 6,339,251 | B2 | 1/2002 | Ha |
| 2003/0216009 | A1 | 11/2003 | Matsuura |
| 2006/0012012 | A1* | 1/2006 | Wang et al. ............ 257/620 |
| 2006/0024921 | A1 | 2/2006 | Huang |
| 2007/0267724 | A1 | 11/2007 | Jeng |

FOREIGN PATENT DOCUMENTS

| EP | 0547684 | | 6/1993 |
| JP | 11186119 | A | 7/1999 |
| JP | 2003332270 | A | 11/2003 |
| JP | 2008505486 | A | 2/2008 |
| WO | 2006007142 | A2 | 1/2006 |

OTHER PUBLICATIONS

Jiun et al: "Effect of wafer thinning methods towards fracture strength and topography of silicon die" Microelectronics and reliability, Elsevier Science LTD, GB LNKDDOI: 10.1016/J. MICROREL.2005.7.110, vol. 46, No. 5-6, May 1, 2006, pp. 836-845, XP005350884 ISSN: 0026-2714 p. 837-p. 840; figures 4,6,7.
Chandrasekaran et al., "Panelized Backside Processing for Thin Semiconductors", U.S. Appl. No. 12/437,168, filed May 7, 2009, 36 pages.
Gu et al., "Stress Balance Layer on Semiconductor Wafer Backside", U.S. Appl. No. 12/483,759, filed Jun. 12, 2009, 42 pages.
Chandrasekaran et al., "Variable Feature Interface That Allows a Balanced Stress to Prevent Thin Die Warpage", U.S. Appl. No. 12/540,586, filed Aug. 13, 2009, 31 pages.
International Search Report and Written Opinion—PCT/US2010/034102, International Search Authority—European Patent Office—Jul. 13, 2010.

* cited by examiner

*Primary Examiner* — Ajay K Arora
(74) *Attorney, Agent, or Firm* — Michelle Gallardo

(57) ABSTRACT

A semiconductor wafer has a semiconductor substrate and films on the substrate. The substrate and/or the films have at least one etch line creating a discontinuous surface that reduces residual stress in the wafer. Reducing residual stress in the semiconductor wafer reduces warpage of the wafer when the wafer is thin. Additionally, isolation plugs may be used to fill a portion of the etch lines to prevent shorting of the layers.

17 Claims, 6 Drawing Sheets

DISCONTINUOUS THIN SEMICONDUCTOR WAFER SURFACE FEATURES

TECHNICAL FIELD

The present disclosure generally relates to integrated circuits (ICs). More specifically, the present disclosure relates to manufacturing integrated circuits.

BACKGROUND

Semiconductor dies include collections of transistors and other components in an active layer of a substrate and a film layer. Commonly, these substrates are semiconductor materials, and, in particular, silicon. Additionally, these substrates are conventionally thicker than necessary to obtain desirable device behavior. The semiconductor dies are singulated or diced from a semiconductor wafer. Conventionally, the layers are deposited on semiconductor wafers that are cingulated or diced to form semiconductor dies.

Thick substrates have advantages during semiconductor manufacturing outside of transistor behavior. During manufacturing of wafers and/or dies, a substrate endures dozens of processes, high temperatures, and transfers between tools or even fabrication sites. During these transfers the substrate can break, resulting in a loss of time and resources. Thick substrates are less likely to break during manufacturing.

The film layer deposited on the substrate has a different stress than the substrate resulting in unbalanced stress. When the stress between the substrate and film layer is unbalanced, the substrate may warp or bend to reach an equilibrium stress. Thick substrates are able to counterbalance the stress imposed by the film layer better than thin substrates. Problems with using thin substrates during manufacturing have conventionally been solved by attaching the thin substrate to a thick support substrate by adhesives. The support substrate is referred to as a carrier wafer. The carrier wafer is detached after completion of the portions of the manufacturing process during which the thin substrate is at risk of fracturing.

Use of a carrier wafer is undesirable for several reasons. The carrier wafer adds cost to manufacturing but does not add tangible value to the final product. Additionally, the adhesives that attach the carrier wafer to the thin substrate leave residue on the thin substrate of the semiconductor wafer. Although the carrier wafer provides stability during manufacturing, releasing the thin substrate from the carrier wafer represents a manufacturing challenge.

One example of manufacturing using a thin substrate is construction of stacked ICs. Stacked ICs increase device functionality and decrease die size by stacking dies vertically. Similar to high-rise towers that fit more office space in a smaller land area, stacked ICs offer more space for transistors and other components while occupying the same area.

In stacked ICs, a second die is stacked on a first die allowing construction to expand into three dimensions (3D). Stacked ICs allow products with a greater number of components to fit in small form factors. Component density of a semiconductor die is number of components in the die divided by the die area. For example, stacking a die on an identical die results in approximately double the number of components in the same area to double component density. When a second die is stacked on a first die, the two dies share the same packaging and communicate to external devices through the packaging.

Conventionally, the second die is coupled to packaging and external devices with through silicon vias located in the first die. Through silicon vias are limited in aspect ratio based, in part, on the manufacturing technique selected. As a result, the height of the first die is limited in order to ensure the through silicon via may extend the entire height of the first die. The through silicon via should extend the entire height to obtain a conducting path from a packaging substrate to the second die. As the height of the first die decreases to accommodate the through silicon via manufacturing, the first die loses structural strength.

Manufacturing a stacked IC conventionally includes attaching a first die to a carrier wafer for support before thinning the first dies. The first dies is then thinned to accommodate the height of the through silicon vias. The semiconductor wafer of the first dies should be released from the carrier wafer after thinning to package the stacked IC. However, once released from the carrier wafer, the first die may have an unbalanced stress between the substrate and the film layer.

Thus, there is a need for releasing the stress on a wafer.

BRIEF SUMMARY

According to one aspect of the disclosure, a semiconductor wafer includes a semiconductor substrate having a front side and a back side. The semiconductor wafer also includes a film layer on the front side of the semiconductor substrate. At least one of the film layer and the semiconductor substrate has a first discontinuous surface having at least one etch line. The discontinuous surface reduces residual stress in the semiconductor wafer.

According to another aspect of the disclosure, a method of manufacturing a semiconductor wafer includes thinning the semiconductor wafer. The method also includes etching at least one etch line in the semiconductor wafer after thinning the semiconductor wafer to form a discontinuous surface. The discontinuous surface relieves stress in the semiconductor wafer.

According to a further aspect of the disclosure, a semiconductor wafer includes a semiconductor substrate. The semiconductor wafer also includes a film layer. The semiconductor wafer further includes means for relieving stress in at least one of the semiconductor substrate and the film layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
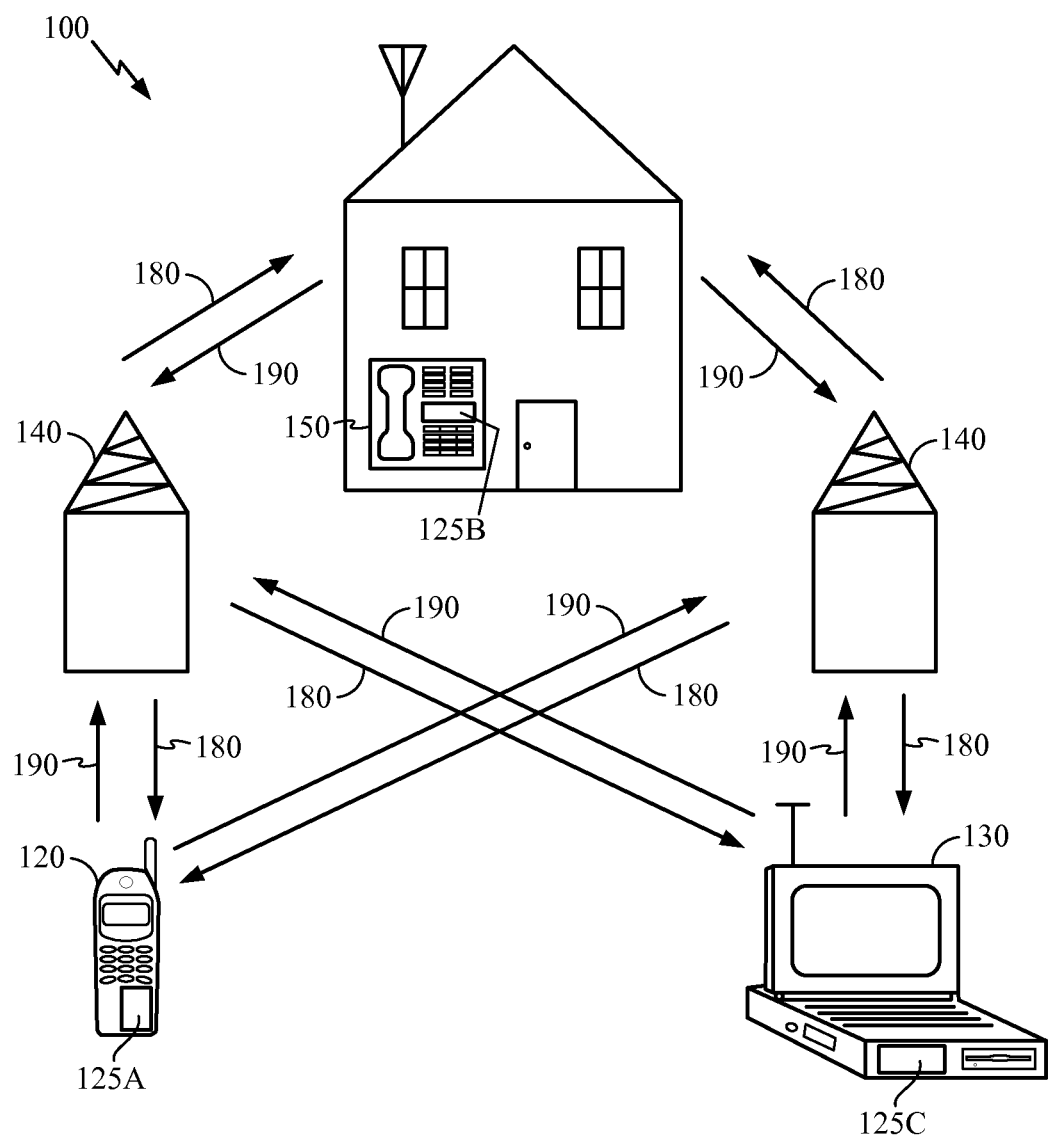
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include IC devices 125A, 125B and 125C, that include circuitry manufactured by the processes disclosed here. It will be recognized that any device containing an IC may also include semiconductor components having the disclosed features and/or components manufactured by the processes disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be a device such as a music player, a video player, an entertainment unit, a navigation device, a communications device, a personal digital assistant (PDA), a fixed location data unit, and a computer. Although FIG. 1 illustrates remote units according to the teachings of the disclosure, the disclosure is not limited to these exemplary illustrated units. The disclosure may be suitably employed in any device which includes semiconductor components, as described below.

Figure 2:
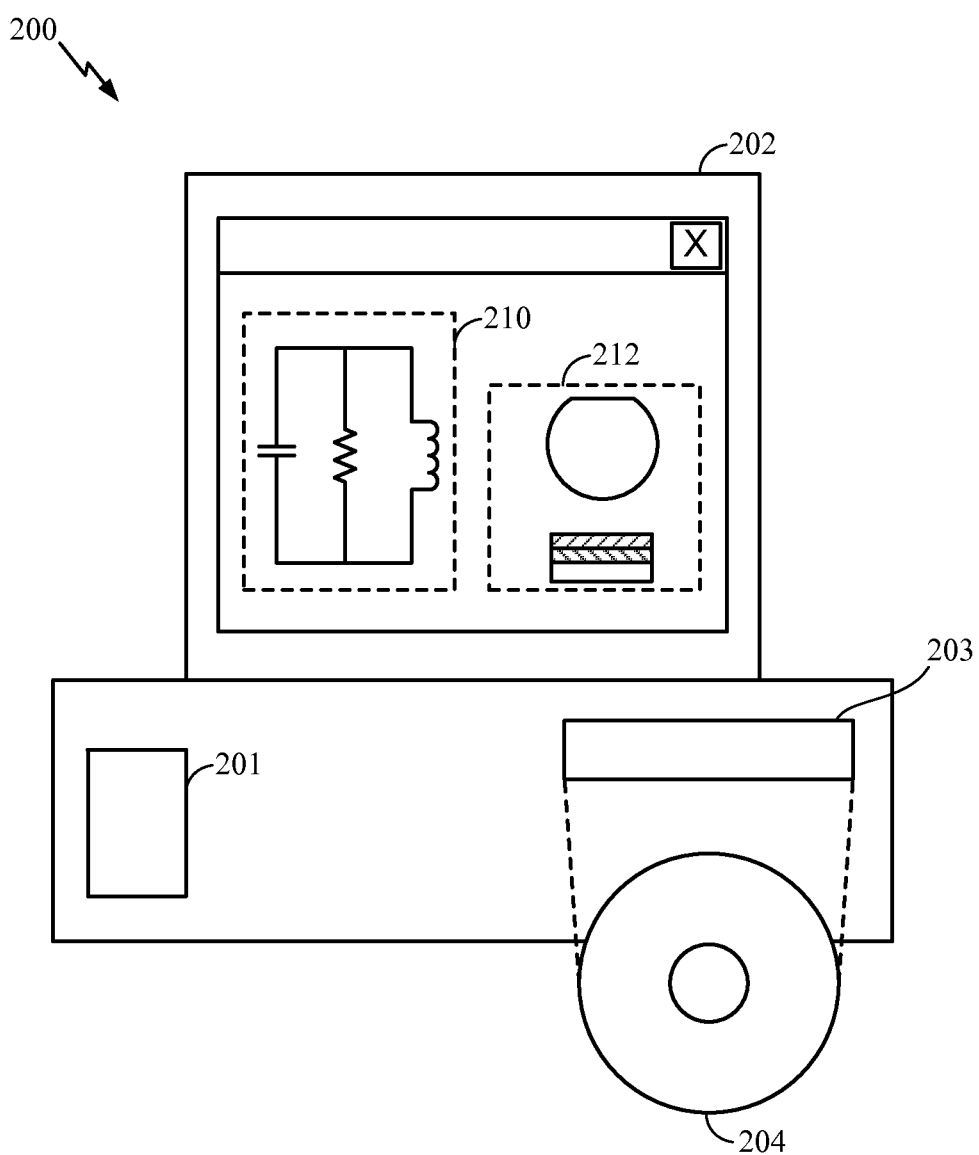
FIG. 2 is a block diagram illustrating a design workstation used for circuit, layout, and logic design of a semiconductor component as disclosed below.

FIG. 2 is a block diagram illustrating a design workstation used for circuit, layout, and logic design of a semiconductor component as disclosed below. A design workstation 200 includes a hard disk 201 containing operating system software, support files, and design software such as Cadence or OrCAD. The design workstation 200 also includes a display to facilitate design of a circuit 210 or a semiconductor wafer 212. A storage medium 204 is provided for tangibly storing the circuit design 210 or the semiconductor wafer 212. The circuit design 210 or the semiconductor wafer 212 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 or the semiconductor wafer 212 by decreasing the number of processes for designing semiconductor wafers.

Figure 3:
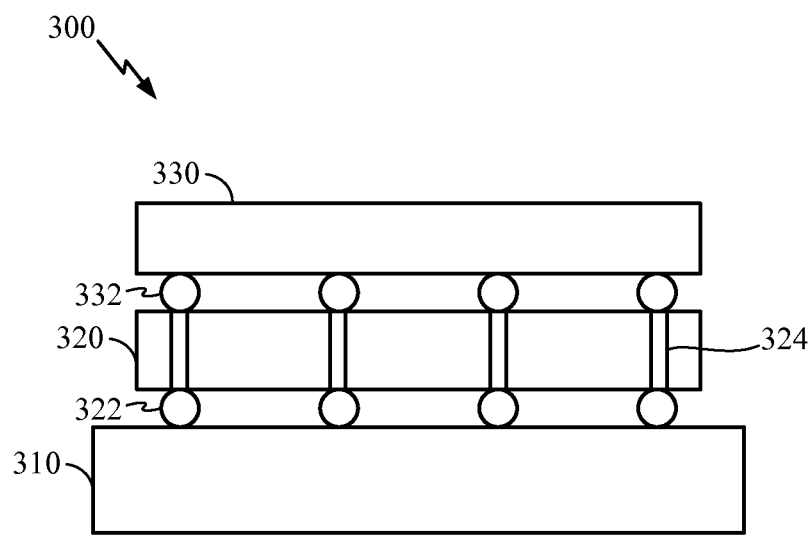
FIG. 3 is a block diagram illustrating a stacked IC.

FIG. 3 is a block diagram illustrating a stacked IC. A stacked IC 300 includes a packaging substrate 310. The packaging substrate 310 is coupled to a first tier die 320 through a packaging connection 322 such as bumps in a ball grid array. Alternatively, pins or other suitable packaging connections may be used. A second tier die 330 is coupled to the first tier die 320 through a packaging connection 332 such as bumps in a ball grid array. The first tier die 320 includes through silicon vias 324. The through silicon vias 324 extend the entire height of the first tier die 320 and couple the packaging substrate 310 to the packaging connection 332 to allow communication from the packaging substrate 310 to the first tier die 320 or the second tier die 330. Additional dies (not shown) may be stacked further on top of the second tier die 330.

Stacked ICs, such as the stacked IC 300, allow manufacturing of higher density ICs through 3D stacking than could be achieved on a 2D IC. For example, the second tier die 330 may be a memory or cache device, and the first tier die 320 may be a processor or other logic circuitry. A large portion of a microprocessor's die area is occupied by L2 cache. Stacking the cache on the logic circuitry may reduce the die size of the microprocessor. Alternatively, DRAM components, located on dies separate from a microprocessor may be stacked on the microprocessor. Stacking DRAM components on a microprocessor may reduce space constraints on a motherboard. Additionally, locating DRAM components closer to the microprocessor may reduce latency and allow use of methods that increase bandwidth to the DRAM components, such as higher clock rates. For at least these reasons, higher densities of components achievable using stacked ICs are expected to support development of future ICs.

When the second tier die 330 is attached to the first tier die 320, damage may occur as a result of the physical force placed on the first tier die 320. The thickness of the first tier die 320 corresponds to its mechanical strength to withstand these physical forces. Thus, when the first tier die 320 is thinned to expose the through silicon vias 324, damage is more likely to occur to the first tier die 320 during attachment of the second tier die 330.

Figure 4:
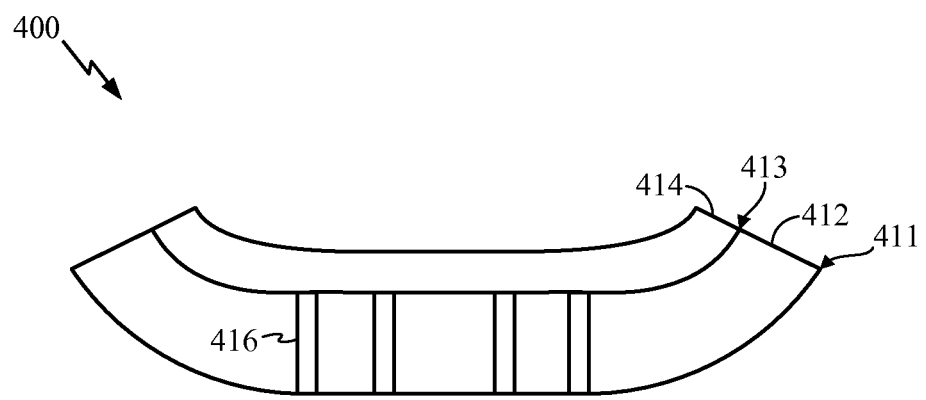
FIG. 4 is a block diagram illustrating a die under tensile stress.

FIG. 4 is a block diagram illustrating a die under tensile stress. A die 400 has a substrate 412 and a film layer 414. The substrate 412 includes, for example, bulk silicon or other semiconductor materials and an active layer of components such as transistors. The film layer 414 may include interconnects, vias, isolation layers such as silicon nitride or silicon oxide, and additional layers such as contacts. Through silicon vias 416 are located in the substrate 412 to allow coupling between a front side 413 of the substrate 412 and a back side 411 of the substrate 412. For example, the die 400 may be a first tier in a stacked IC mounted on a packaging substrate (not shown). In this case, the through silicon vias 416 may couple a second tier of the stacked IC to the packaging substrate.

The through silicon vias 416 are formed with etching techniques such as, for example, reactive ion etching, wet etching, or laser drilling. The height of the through silicon vias 416 is limited and determined, in part, by the width of the through silicon vias 416. For example, an etch process may have an etch ratio of 10:1, indicating the etch may only proceed ten times as deep as the through silicon vias 416 are wide. In this case, a 1 μm through silicon via may be etched 10 μm deep. Thus, the height of the substrate 412 should be smaller than that allowed by the selected etching The mechanical strength of the substrate 412 is proportional to the height of the substrate 412. Thus, reducing the height of the substrate 412 to allow the through silicon vias 416 to extend from the front side 413 to the back side 411 reduces the mechanical strength of the substrate 412. The film layer 414 remains a fixed height during thinning of the substrate 412. Thus, the substrate 412 has less strength to support the same level of stresses built up in the film layer 414 regardless of the height of the substrate 412. Stresses in the film layer 414 can be residual compressive or residual tensile depending on the number and type of films of which the film layer 414 is composed. If there is a net residual compressive stress on the substrate 412, the substrate 412 will tend to push outwards and the entire assembly will bend in a frown shape. If there is a net residual tensile stress on the substrate 412, the substrate 412 will tend to push inwards and the entire assembly will bend in a smile shape.

Further, temperature may affect the stress in the film layer 414 and the substrate 412. For example, as temperature rises the different materials may expand at different rates. If the film layer 414 expands at a faster rate than the substrate 412, the substrate 412 may warp due to lack of mechanical strength. Warpage may damage components in the active layer of the substrate 412, structures in the film layer 414, or cause problems later in manufacturing.

Additionally, components in the active layer on the substrate 412 are designed to function properly in specific stress ranges. For example, tensile stress improves carrier mobility in nFET devices.

In addition to built-up stress in the film layer 414, manufacturing processes damage the front side 413 of the substrate 412. Damage is caused by impact of energetic particles on the substrate 412 during plasma processes such as reactive ion etch and metal deposition. The damage may also be caused by exposure to chemicals used during wet etch or cleaning. When the front side 413 of the substrate 412 is damaged, the stress of the damaged portion is different from the bulk of the substrate 412. These differences in stress lead to additional warpage problems in manufacturing.

Release of stress in a film layer or a substrate may be accomplished by performing an etch of the substrate and/or the film layers to form a discontinuous surface. The etched areas provide stress relief by allowing atoms in the discontinuous surface to expand and reach equilibrium. Discontinuous surface features will be described in further detail below.

Figure 5:
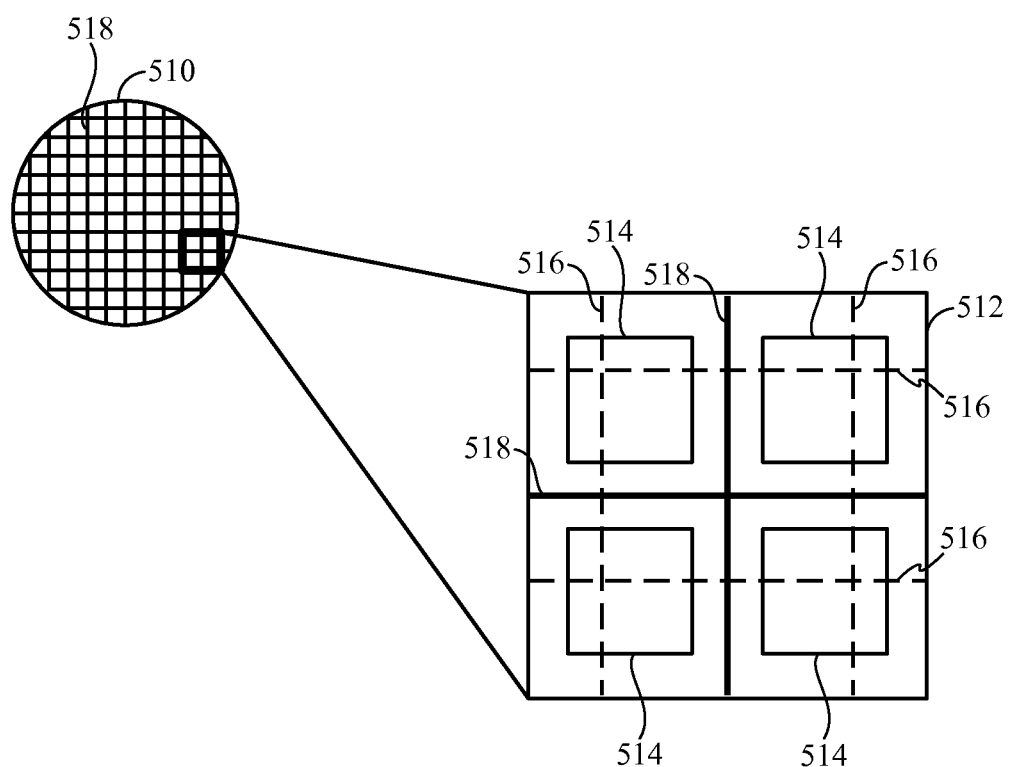
FIG. 5 is a block diagram illustrating a top view of a wafer having exemplary discontinuous surface features according to one embodiment.

FIG. 5 is a block diagram illustrating a top view of a wafer having exemplary discontinuous surface features according to one embodiment. A top-view is shown of a wafer 510. The wafer 510 contains dies 514 separated by dicing channels 518, which may be used to separate the dies. A subset of the dies is shown in a box 512. The box 512 illustrates dies 514 on the wafer 510. The dies 514 include film layers and a substrate including an active layer. Differences in stress between film layer and the substrate create warpage of the wafer 510 as the layers reach equilibrium. Etch lines 516 are lines of material removed from the film layer, the active layer of the substrate, the front side of the bulk silicon, the back side of the bulk silicon, or any combination thereof to form discontinuous surface features that relieve stress.

The etch lines 516 do not affect other electrical characteristics of the wafer 510 or the dies 514. For example, when the etch lines are in the film layer, the etch lines may bend around interconnects such that interconnects or vias are not severed. Further, if the etch lines 516 are in the active layer of the substrate, the etch lines 516 may bend around source/drain regions or channels in the active layer of the substrate.

If the film layer includes multiple layers of different materials, a fraction of the etch lines 516 may be in a first layer of the film layer and a fraction of the etch lines 516 may be in a second layer of the film layer. In this way, the etch lines 516 may be at different heights in the wafer 510. The etch lines 516 are shown as substantially orthogonal horizontal and vertical lines but may take any shape. The shape may be defined when forming the etch lines 516 in a photolithography process, as described below.

Forming the etch lines 516 may be accomplished using etch techniques such as reactive ion etching or wet etching used in combination with photolithography techniques such as electron beam lithography or deep UV photolithography. The manufacturing process will be described in more detail below with reference to FIG. 6.

Figure 6:
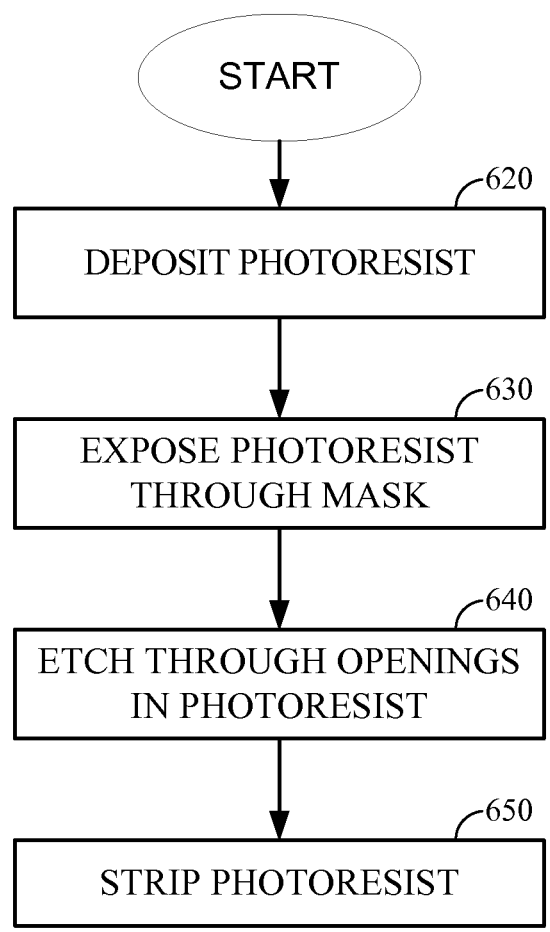
FIG. 6 is a block diagram illustrating a manufacturing process for exemplary discontinuous surface features according to one embodiment.

FIG. 6 is a block diagram illustrating a manufacturing process for exemplary discontinuous surface features according to one embodiment. At block 620 a photoresist is deposited on the wafer. The photoresist material is selected to match the light source used during exposure. For example, if the light source is an electron beam then polymethylmethacrylate may be deposited on the wafer. At block 630 the photoresist is exposed through a mask using a light source appropriate for the photoresist deposited at block 620. The mask contains features such as etch lines shown in FIG. 5.

If a positive tone photoresist is deposited at block 620, areas exposed to the light source will dissolve away after development of the photoresist. The unexposed photoresist acts as a mask to prevent etching of material during following processes that will remain.

If a negative tone photoresist is deposited at block 620, areas not exposed to the light source will dissolve away after development of the photoresist. A tone reversal process such as depositing a metal and lifting away the photoresist as is well known in the art may be performed.

At block 640, an etch such as reactive ion etch may be performed to remove materials on the wafer. The etch chemistry is selected to remove the material targeted for discontinuous surface features. For example, if a silicon nitride layer is to be etched to form a discontinuous silicon nitride surface a reactive ion etch including $CF_4$ may be chosen. Additionally, more than one layer of the film layer may be etched. For example, the etch may remove a silicon nitride layer and a metal layer. In this case a single etch chemistry or multiple etch chemistries may be used.

After etching is complete, any remaining photoresist is stripped at block 650. Additional cleaning and rinsing steps may be performed as part of stripping the photoresist to remove residue on the wafer.

Alternatively, the mask used for exposure in block 630 may be inverted to allow the process to operate with negative tone photoresist without the tone reversal process.

According to another embodiment, the discontinuous surface may be formed using a focused ion beam. In this embodiment no photoresist is used. The focused ion beam is scanned across the surface of the wafer and materials on the wafer are etched where the focused ion beam is scanned. For example, lines such as etch lines shown in FIG. 5 may be scanned by a focused ion beam.

Figure 7:
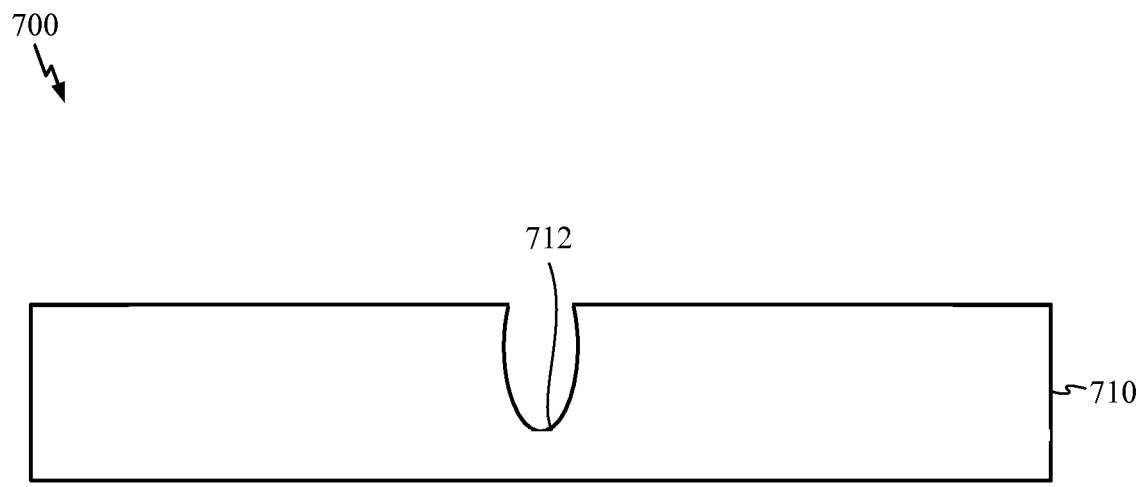
FIG. 7 is a block diagram illustrating a cross-sectional view of a wafer having exemplary discontinuous surface features in a substrate according to one embodiment.

In one embodiment, exemplary discontinuous surface features are formed in a substrate of the wafer to relieve stress in the substrate. FIG. 7 is a block diagram illustrating a cross-sectional view of a wafer having exemplary discontinuous surface features in a substrate. A wafer 700 includes a substrate 710. An etch line 712 formed through manufacturing processes as described above with reference to FIG. 6 results in a discontinuous surface feature. At the etch line 712 atomic planes of the substrate 710 are broken and the atomic planes are allowed to expand into the etch line 712 to relieve stress in the substrate 710. The etch line 712 may be in either a front side or back side of the substrate 710.

Figure 8:
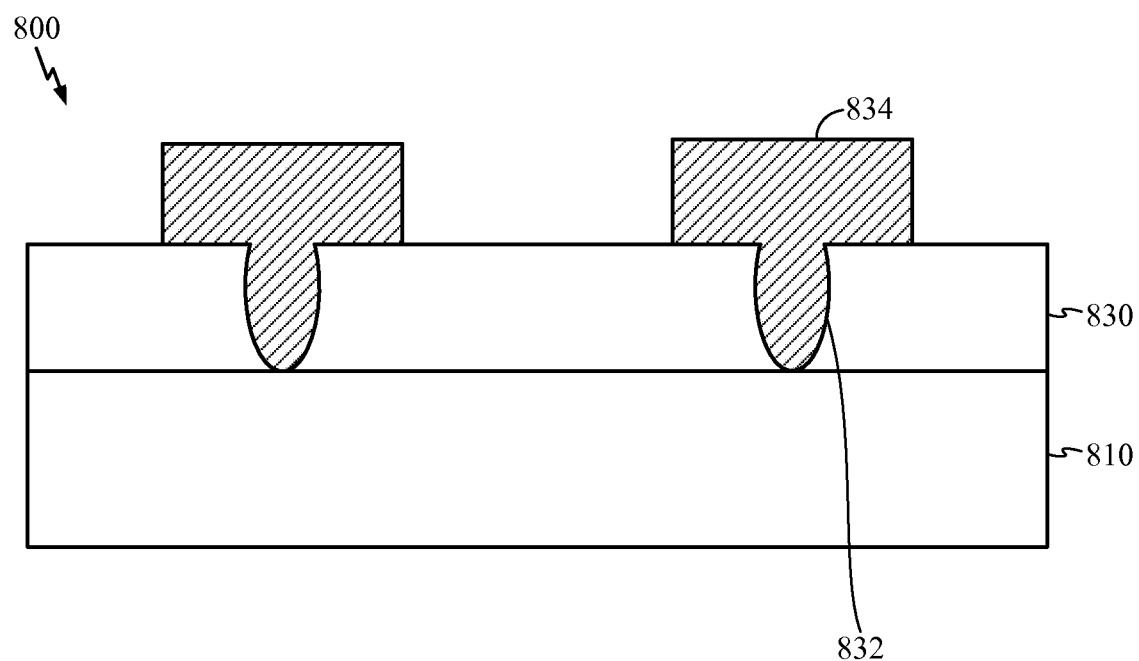
FIG. 8 is a block diagram illustrating a cross-sectional view of a wafer having exemplary discontinuous surface features in a film layer according to one embodiment.

In another embodiment, exemplary discontinuous surface features are formed in a film layer of the wafer to relieve stress in the film layer. FIG. 8 is a block diagram illustrating a cross-sectional view of a wafer having exemplary discontinuous surface features in a film layer. A wafer 800 includes a substrate 810 and a film layer 830.

The film layer 830 includes an etch line 832. The etch line 832 results in a discontinuous surface feature in the film layer 830. At the etch line 832, atomic planes in the film layer 830 may expand to relieve stress in the film layer 830. Although a single etch line is shown, multiple etch lines could also be provided. The etch line 532 may be in either a front side or a back side of the substrate 810.

After the etch line 832 is formed in the film layer 830, an isolation plug 834 may be deposited to partially or completely fill the etch line 832. The isolation plug 834 prevents future layers deposited on the film layer 830 from interfering with the film layer 830. For example, if a metal layer is deposited on the film layer 830, interconnects or vias in the film layer 830 may be shorted by the metal layer. Desirable properties of materials used for the isolation plug 834 include a matched coefficient of thermal expansion and good adhesion between the film layer 830 and the isolation plug 834 to prevent delamination. The isolation plug 834 may be, for example, silicon dioxide, silicon nitride, or polyimide.

Although not shown, the isolation plug 834 may be level with the film layer 830. After deposition of the isolation plug 834, a chemical mechanical polishing process may be used to bring the isolation plug 834 level with the film layer 830.

Although only one film layer is shown in FIG. 8, the film layer may include multiple layers of interconnects or vias including copper or aluminum layers, components such as transistors or capacitors, and insulating layers such as silicon oxide or silicon nitride. As noted above, the etch line(s) could be in any one or more of the film layers.

The discontinuous surface features in the substrate as illustrated above with reference to FIG. 7 and in the film layer as illustrated above with reference to FIG. 8 may be used in combination on a wafer according to one embodiment to relieve stress in multiple locations of the wafer.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor wafer, comprising:
a semiconductor substrate having a first side;
a film layer on the front first side of the semiconductor substrate;
wherein the film layer and/or the semiconductor substrate has a first discontinuous surface comprising at least one etch line disposed around features of the film layer or the semiconductor substrate, the first discontinuous surface reducing residual stress in the semiconductor wafer; and
a non-conductive isolation plug completely filled with a solid insulating material, filling at least a portion of the at least one etch line, the non-conductive isolation plug being flush with a surface of the film layer that is opposite the surface of the film layer adjacent to the semiconductor substrate.

2. The semiconductor wafer of claim 1, in which the at least one etch line reduces warpage of the semiconductor wafer.

3. The semiconductor wafer of claim 1, further comprising a second discontinuous surface in the film layer comprising at least one etch line, in which the first discontinuous surface is also in the film layer.

4. The semiconductor wafer of claim 3, in which the first discontinuous surface is substantially orthogonal to the second discontinuous surface.

5. The semiconductor wafer of claim 1, in which the non-conductive isolation plug comprises a silicon oxide film.

6. The semiconductor wafer of claim 1, in which the film layer comprises a silicon nitride layer, the first discontinuous surface being in the silicon nitride layer.

7. The semiconductor wafer of claim 1, in which the first discontinuous surface comprises at least two etch lines substantially orthogonal to each other.

8. The semiconductor wafer of claim 1, incorporated into a device selected from a group consisting of a music player, a video player, an entertainment unit, a navigation device, a communications device, a personal digital assistant (PDA), a fixed location data unit, and a computer.

9. The semiconductor wafer of claim 1, in which the features of the film layer comprise interconnects or vias.

10. The semiconductor wafer of claim 1, in which the features of the semiconductor substrate comprise source/drain regions or channels.

11. A semiconductor wafer, comprising:
a semiconductor substrate;
a film layer on a first side of the semiconductor substrate;
means for relieving stress in the semiconductor substrate and/or the film layer, the stress relieving means disposed around features of the film layer or the semiconductor substrate; and
means for electrically isolating, the isolating means including a solid insulating material, the isolating means filling at least a portion of the stress relieving means, isolating means being flush with a surface of the film layer that is opposite the surface of the film layer adjacent to the semiconductor substrate.

12. The semiconductor wafer of claim 11, in which the isolating means prevents shorting of signals across the stress relieving means.

13. The semiconductor wafer of claim 11, in which the stress relieving means is disposed in the film layer.

14. The semiconductor wafer of claim 11, in which the stress relieving means is disposed in the semiconductor substrate.

15. The semiconductor wafer of claim 11, incorporated into of a music player, a video player, an entertainment unit, a navigation device, a communications device, a personal digital assistant (PDA), a fixed location data unit, and/or a computer.

16. The semiconductor wafer of claim 11, in which the features of the film layer comprise interconnects or vias.

17. The semiconductor wafer of claim 11, in which the features of the semiconductor substrate comprise source/drain regions or channels.

* * * * *